United States Patent
Werking

(10) Patent No.: US 7,903,011 B2
(45) Date of Patent: Mar. 8, 2011

(54) DIFFERENTIAL CURRENT-MODE TRANSLATOR IN A SIGMA-DELTA DIGITAL-TO-ANALOG CONVERTER

(75) Inventor: Paul M. Werking, Rockford, MN (US)

(73) Assignee: Honeywell International Inc., Morristown, NJ (US)

(*) Notice: Subject to any disclaimer, the term of this patent is extended or adjusted under 35 U.S.C. 154(b) by 353 days.

(21) Appl. No.: 11/898,533

(22) Filed: Sep. 12, 2007

(65) Prior Publication Data

US 2009/0135036 A1 May 28, 2009

Related U.S. Application Data

(60) Provisional application No. 60/825,543, filed on Sep. 13, 2006.

(51) Int. Cl.
*H03M 1/66* (2006.01)
(52) U.S. Cl. .............. 341/144; 323/316; 327/543
(58) Field of Classification Search .......... 341/133, 341/136, 143, 144, 153; 323/315, 316; 327/543
See application file for complete search history.

(56) References Cited

U.S. PATENT DOCUMENTS

| | | | |
|---|---|---|---|
| 4,384,274 A | 5/1983 | Mao | |
| 4,683,458 A | 7/1987 | Hallgren | |
| 5,146,224 A * | 9/1992 | Kitayoshi | 341/147 |
| 5,343,197 A * | 8/1994 | Kanai et al. | 341/152 |
| 5,563,597 A | 10/1996 | McCartney | |
| 5,724,039 A | 3/1998 | Hayashi | |
| 5,815,103 A | 9/1998 | Comminges et al. | |
| 5,870,044 A | 2/1999 | Dell'ova et al. | |
| 5,889,484 A | 3/1999 | Noguchi | |
| 5,990,711 A * | 11/1999 | Sekimoto | 327/112 |
| 6,275,179 B1 | 8/2001 | Mori | |
| 6,356,141 B1 * | 3/2002 | Yamauchi | 327/543 |
| 6,433,722 B1 * | 8/2002 | Gata et al. | 341/144 |
| 6,501,409 B1 | 12/2002 | Lynn et al. | |
| 6,593,868 B2 | 7/2003 | Clara et al. | |
| 6,965,333 B1 | 11/2005 | Hsu | |
| 7,256,720 B2 | 8/2007 | Fukuda | |
| 7,277,035 B1 | 10/2007 | You et al. | |
| 7,400,285 B2 | 7/2008 | Nicollini et al. | |
| 7,423,573 B2 | 9/2008 | Baginski et al. | |

(Continued)

OTHER PUBLICATIONS

D'Amico et al., Low-power reconfigurable baseband block for UMTS/WLAN transmitter, IEEE, Proceedings Norchip Conference 2004, Nov. 2004, pp. 103-106.*

(Continued)

*Primary Examiner* — Howard Williams
(74) *Attorney, Agent, or Firm* — Shumaker & Sieffert, P.A.

(57) ABSTRACT

A differential current-mode sigma-delta digital-to-analog converter (SD DAC) and a method for generating positive and negative reference voltages in a sigma-delta digital analog converter are described. The SD DAC includes a low pass filter (LPF) having a first and second input. The SD DAC further includes a first resistance and a second resistance coupled together at a common node. The first resistance may be coupled to the first input of the LPF and the second resistance may be coupled to the second input of the LPF. Additionally, the SD DAC includes a current supply and a switching network for supplying current from the current supply to the first and second resistances. The current supply and the resistances operate to generate a first voltage and a second voltage at the first and second inputs of the LPF.

19 Claims, 3 Drawing Sheets

U.S. PATENT DOCUMENTS

| | | |
|---|---|---|
| 7,425,909 B2 | 9/2008 | Rose et al. |
| 2002/0063648 A1* | 5/2002 | Meroni et al. ............... 341/144 |
| 2002/0105454 A1* | 8/2002 | Nanba et al. ................ 341/145 |
| 2003/0038740 A1* | 2/2003 | Mulder et al. ............... 341/144 |
| 2005/0225464 A1* | 10/2005 | Lin et al. .................... 341/144 |
| 2006/0139193 A1* | 6/2006 | Morrow et al. .............. 341/143 |
| 2007/0279105 A1* | 12/2007 | Sunairi ....................... 327/108 |
| 2008/0231335 A1 | 9/2008 | Werking |
| 2009/0016544 A1 | 1/2009 | Li et al. |

OTHER PUBLICATIONS

Ghittori et al., a low-power, low-voltage (11mW/8.4mW, 1.2V) DAC+filter for multistandard (WLAN/UMTS) transmitters, 2005 Symposium on VLSI Circuits, Digest of Technical Papers. IEEE 2005. Jun. 16-18, 2005 On pp. 334-337.*

Kester, W.; Data conversion handbook—p. 420 Walter Allan Kester, Data Conversion Handbook, p. 420 Analog Devices, inc -Technology & Engineering—2005—953 pages.*

U.S. Appl. No. 12/456,061, filed Jun. 11, 2009, entitled "Current-Mode Sigma-Delta Digital-To-Analog Converter," Paul M. Werking.

* cited by examiner

DIFFERENTIAL CURRENT-MODE TRANSLATOR IN A SIGMA-DELTA DIGITAL-TO-ANALOG CONVERTER

RELATED APPLICATIONS

The present patent application claims priority under 35 U.S.C. §119(e) to U.S. Provisional Patent Application Ser. No. 60/825,543, which was filed Sep. 13, 2006. The full disclosure of U.S. Provisional Patent Application Ser. No. 60/825,543 is incorporated herein by reference.

GOVERNMENT RIGHTS

The United States Government has acquired certain rights in this invention pursuant to Contract No. DAAE30-01-9-0100, awarded by the U.S. Army Tank-Automotive and Armaments Command Armament Research, Development and Engineering Center (TACOM-ARDEC).

FIELD

The present invention relates to sigma-delta digital-to-analog converters, and more specifically, to a differential current-mode translator in a sigma-delta digital-to-analog converter.

BACKGROUND

Sigma-delta digital-to-analog converters (SD DACs) are often used in mixed signal integrated circuits (ICs) that combine digital and analog circuits on the same substrate. Generally, SD DACs consist of a two-state voltage translator followed by a low-pass filter (LPF). The voltage accuracy of the overall SD DAC is generally determined by the input voltage translator.

FIG. 1 is a circuit diagram of an example of a typical SD DAC 100. SD DAC 100 includes a voltage translator stage 102 coupled with a low pass filter 104. The voltage translator stage 102 provides a replica of an input digital signal (DIN) 106 that switches between two relatively stable and accurate voltage references, $V_P$ and $V_N$. It is possible to use a simple 1-to-1 translator in which the $V_P$ voltage is the same as the logic high voltage (or supply voltage) of the DIN signal and the $V_N$ voltage is the logic low voltage of the DIN signal (or ground). However, this approach is avoided in high precision systems due to various artifacts. These artifacts include, but are not limited to, supply voltage temperature effects, supply voltage loading effects, and various uncontrolled IR drops (i.e., noise) in the both the ground and supply loops.

The steady state output voltage of an SD DAC is proportional to the density-of-ones, or equivalent duty cycle, d, of the input data stream. For SD DAC 100, the steady state output voltage may be expressed as follows.

$$V_{OUT}=d(DIN)(V_P+V_N)-V_N$$

For d(DIN)=0, $V_{OUT}=-V_N$. For d(DIN)=1, $V_{OUT}=V_P$. For d(DIN)=0.5, $V_{OUT}=0.5(V_P-V_N)$. If $V_P=V_N$, then for d(DIN)=0.5, $V_{OUT}=0$. As is known in the art, $V_{OUT}=0$ is an important condition for proper performance of an SD DAC. For example, $V_{OUT}=0$ is an important condition for rebalancing accelerometers such as MEMS based accelerometers. Therefore, what happens if $V_P$ is not equal to $V_N$ is of great concern.

Generally, there are two classes of errors that can be labeled as offset errors and gain errors. These errors may affect the performance of an SD DAC. Both offset errors and gain errors may be defined in terms of an external reference voltage, $V_R$.

Offset errors occur when $V_P \neq V_N$. Gain errors occur when the average magnitude of $V_P$ and $V_N$ differs from $V_R$. That is, gain errors occur when $(V_P+V_N) \neq 2V_R$. It is possible to have gain errors without offset errors if $V_P=V_N$. Likewise, it is possible to have offset errors without gain errors if $(V_P+V_N)=2V_R$. However, both types of errors generally will occur together in most systems.

The offset voltage component, $V_{OF}$, may be computed as follows.

$$V_{OF}=(V_P-V_N)/2$$

Generally, however, it is more useful to know how $V_{OF}$ compares to $V_R$ than to have the absolute voltage value of $V_{OF}$. Therefore, it is useful to define a relative offset error in terms of a dimensionless quantity, $E_{OF}$. By definition, $$E_{OF}=V_{OF}/V_R=(V_P-V_N)/2V_R.$$

Gain error, $E_G$, may be calculated from the gain of the SD DAC. The gain of an SD translator, G, may be defined as follows.

$$G=(V_P+V_N)/2V_R$$

Nominally, G is unity for $V_P=V_N=V_R$. Gain error, $E_G$, is also a dimensionless quantity and may be defined as $$E_G=G-1=(V_P+V_N-2V_R)/2V_R.$$

Rather than expressing $E_{OF}$ and $E_G$ as above, it is often useful and more convenient to express $E_{OF}$ and $E_G$ differently. For instance, let $E_P=(V_P-V_R)/V_R$ represent the relative error of the positive reference voltage and $E_N=(V_N-V_R)/V_R$ represent the relative error of the negative reference voltage. $E_{OF}$ and $E_G$ may be expressed in terms of these error components.

$$E_{OF}=(E_P-E_N)/2$$

$$E_G=(E_P+E_N)/2$$

The offset and gain errors affect the output voltage of an SD DAC. Therefore, when offset error and gain error effects are included, the output voltage of an SD DAC is modified as shown in the equations below.

$$V_{OUT}=Gd(DIN)(V_P+V_N)-V_N+V_{OF}$$

$$V_{OUT}=(1+E_G)d(DIN)(V_P+V_N)-V_N+(E_{OF}V_R)$$

Current SD DAC designs have gain and offset errors that require correction in order to operate at a high precision. It may be possible to overcome these errors in an SD DAC in the digital domain by slight modifications applied to the density-of-ones pattern of the input data stream. However, making such modifications requires additional digital hardware, firmware, and/or software. An SD DAC with reduced offset and gain errors would require less hardware, firmware, and/or software to compensate for offset and gain errors than would an SD DAC with higher errors. Additionally, in some systems, an SD DAC with reduced offset and gain errors may eliminate the need for any means of correction. Therefore, it is highly desirable to reduce these error terms as much as possible at the translator stage in SD DACs. Thus, it would be beneficial to have an SD DAC where these offset and gain errors are reduced.

SUMMARY

The present invention provides a sigma-delta digital-to-analog converter (SD DAC) including a differential current-mode translator and a method for generating positive and negative reference voltages in an SD DAC.

The SD DAC includes a low pass filter having first and second inputs. The SD DAC further includes first and second resistances each having first and second terminals. The first terminals of the resistances are respectively coupled to the first and second inputs of the low pass filter. The second terminals of the resistances are respectively coupled to a common node. The SD DAC further includes a current supply and a switching network for supplying current from the current supply to and from the first and second resistances. In operation, the current supply and the first and second resistances generate a first voltage and a second voltage at the first and second inputs, respectively, of the low pass filter.

The current supply may include a first and second current. The first and second current are preferably matched to within 0.8%. In addition, the resistances of the SD DAC are preferably matched to within 0.4%.

The switching network may be coupled to receive a control signal. The control signal may be a switching signal. The switching signal may preferably be a digital input (DIN) signal. In a preferred embodiment, when the DIN signal is at a logic-1 level, the switching network may operate to supply current from the first current source to the first resistance. This supply may form a first voltage at the first input of the low pass filter. Further, the switching network may operate to supply current from the second current source to the second resistance. This supply may form a second voltage at the second input of the low pass filter. Alternatively, when the DIN is at a logic-0 level, the switching network may operate to supply current from the first current source to the second resistance. This supply may form a first voltage at the second input of the low pass filter. Further, the switching network may operate to supply current from the second current source to the first resistance. This supply may form a second voltage at the first input of the low pass filter.

In a preferred embodiment, the SD DAC has an uncorrected accuracy of at least twelve (12) bits. For example, the SD DAC in accordance with an embodiment of the present invention may have an accuracy of sixteen (16) bits.

A method for generating positive and negative reference voltages in an SD DAC is also described. The method includes receiving a first and second current. The method further includes switching the first and second current between a first resistance and second resistance. The first resistance is connected to a first input of a low pass filter and the second resistance is connected to a second input of the low pass filter. The method further includes generating a first voltage at the first input of the low pass filter and a second voltage at the second input of the low pass filter. In a preferred embodiment, the method includes receiving a digital input signal. Preferably, when the digital input signal is at a logic-1 level, switching the first and second current between a first and second resistance includes providing the first current to the first resistance and the second current to the second resistance. When the digital input signal is at a logic-0 level, switching the first and second current between a first and second resistance includes providing the first current to the second resistance and the second current to the first resistance.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

The described differential current-mode sigma-delta digital-to-analog converter (SD DAC) in accordance with an embodiment of the invention provides an SD DAC with reduced offset and gain errors. As discussed above, current SD DAC designs suffer from gain and offset errors that require correction in order to operate at a high precision. The errors may need to be adjusted using hardware, firmware, and/or software to compensate for the errors. Reducing and/or minimizing the offset and gain errors of an SD DAC before implementing a correction means, however, is preferable. The SD DAC in accordance with an embodiment of the present invention provides an SD DAC with improved uncorrected accuracy by including a differential current-mode translator in the SD DAC. This differential current-mode translator results in reduced gain and offset errors. The following embodiments provide an SD DAC with reduced offset and gain errors compared to other SD DACs and a method for generating reference voltages in an SD DAC that results in an SD DAC with reduced gain and offset errors.

Figure 2:
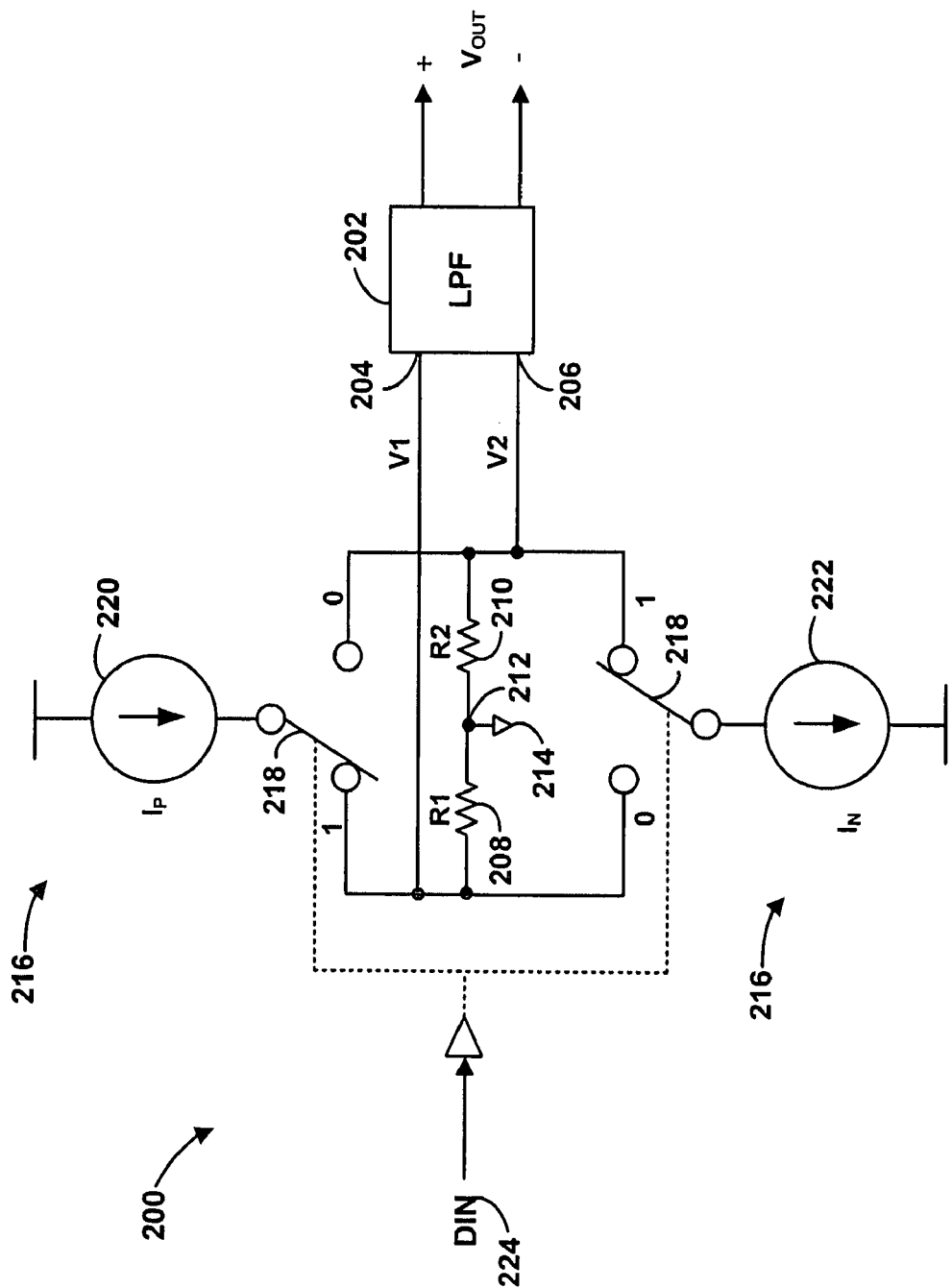
FIG. 2 is a schematic drawing of a differential current-mode SD DAC in accordance with an embodiment of the present invention.

FIG. 2 is a schematic drawing of a differential current-mode SD DAC 200 in accordance with an embodiment of the present invention. The described differential current-mode SD DAC has reduced gain and offset error in comparison to other SD DACs, such as a differential voltage-mode SD DAC.

The SD DAC 200 in accordance with an embodiment of the present invention may include an LPF 202 that has a first input 204 and a second input 206. LPF 202 may be any low pass filter now known or developed in the future. For example, LPF 202 may be two passive single-ended LPFs connected in parallel.

SD DAC 200 may further include a first and second resistance, such as a first resistor 208 and a second resistor 210. The first resistor 208 and the second resistor 210 may be coupled together at a common node 212. Preferably, common node 212 is coupled to ground 214. Further, first resistor 208 may be coupled to first input 204 of LPF 202. Second resistor 210 may be preferably coupled to second input 206 of LPF 202. First resistor 208 and second resistor 210 are preferably matched to within a percentage of each other. For instance, the resistor values may be matched to within 0.4%. Additionally, the resistor values may be equal.

SD DAC 200 preferably includes a current supply 216 and a switching network 218. The current supply 216 preferably includes two currents sources, current $I_P$ source 220 and current $I_N$ source 222. The current $I_P$ source 220 and the current $I_N$ source 222 are preferably matched to within a percentage of each other. For instance, the current $I_P$ source 220 and the current $I_N$ source 222 may be matched to within 0.4%. Additionally, the current from the current $I_P$ source 220 and the current $I_N$ source 222 may be equal.

The switching network 218 may include a first switch and a second switch. The switches are preferably operable to switch current flow between flowing to resistor 208 and resistor 210. Additionally, the switching network 218 is preferably operable to receive a control signal. The control signal may be a switching signal. For instance, the control signal may preferably be digital input signal (DIN) 224. The first switch and second switch may switch depending on DIN 224.

The current supply 216 and the first resistor 208 and second resistor 210 preferably operate to generate a first voltage, V1, and a second voltage, V2, at the first and second inputs of the LPF 202. The voltage generated at these first and second inputs of the LPF 202 may depend on the input signal the switching network 218 receives. Preferably, the switching network 218 operates differentially for digital input signals. For example, switching network 218 preferably operates such that when DIN is at logic-1 level, the current $I_P$ flows through R1 to form a voltage, $V_1=I_PR1=V_{P1}$, that is above ground. The current $I_N$ flows through R2 to form a voltage, $V_2=I_NR2=V_{N1}$, that is below ground. Alternatively, when DIN is at logic-0 level, the current $I_P$ flows through R2 to form a voltage, $V_2=I_PR2=V_{P0}$, that is above ground. The current $I_N$ flows through R1 to form a voltage, $V_1=I_NR1=V_{N0}$, that is below ground In a preferred embodiment, the switching network 218 may preferably include a plurality of transistors. For instance, the switching network 218 may include four (4) transistors. The transistors may operate to direct the current to the resistors based on the value of DIN. Additionally or alternatively, the switching network 218 may include transmission gates. For example, the switching network 218 may be a double pole, double throw (DPDT) switch comprised of a plurality of transmission gates. The transmission gates may be Complementary Metal Oxide Semiconductor (CMOS) transmission gates. Other types of switching networks are possible as well.

A circuit of the type described in reference to FIG. 2 results in reduced offset and gain errors. Therefore, the SD DAC 200 operates with a higher uncorrected accuracy than typical SD DACs. As discussed above, when DIN is at a logic-1 level, the current $I_P$ flows through R1 to form a voltage, $V_1=I_PR1=V_{P1}$, that is above ground. The current $I_N$ flows through R2 to form a voltage, $V_2=I_NR2=V_{N1}$, that is below ground. If $I_P=I_N=I$ and R1=R2=R, then $V_1$ and $V_2$ have equal magnitudes and the nominal full scale voltage across R1 and R2 is $$V_{FS1}=V_{P1}+V_{N1}=V_1+V_2=2IR.$$

When DIN is at a logic-0 level, $V_1=I_NR1=V_{N0}$ and $V_2=I_PR2=V_{P0}$. If $I_P=I_N=I$ and R1=R2=R, then $V_1$ and $V_2$ still have equal magnitudes and the nominal full scale voltage across R1 and R2 remains the same as before.

$$V_{FS0}=V_{N0}+V_{P0}=V_1+V_2=2IR$$

For the sake of discussion, let $$2V_R=V_{FS0}=V_{FS1}=2IR$$

and $V_R$=IR. Gain and offset errors in the SD DAC 200 may then be calculated as follows.

First, consider the effects of gain errors on the circuit of FIG. 2. Errors in the ratio of $I_P$ and $I_N$ contribute to the overall gain error. Let $I_P$=I+ΔI and let $I_N$=I−ΔI, where ΔI represents a small current error that is due a mismatch in the ratio between $I_P$ and $I_N$. In addition to the errors in the ratio of $I_P$ and $I_N$, in the circuit depicted in FIG. 2, errors in the ratio of R1 to R2 contribute to the overall gain error. To account for this error in the ratio of R1 208 and R2 210, let R1=R+ΔR and R2=R−ΔR.

When DIN is at a logic-1 level, the full scale voltage across R1 and R2 becomes $$V_{FS1}=V_{P1}+V_{N1}=(I+\Delta I)(R+\Delta R)+(I-\Delta I)(R-\Delta R).$$

By multiplying terms in the above equation, $V_{FS1}$ expands to $$V_{FS1}=IR+I\Delta R+\Delta IR+\Delta I\Delta R+IR-I\Delta R-\Delta IR+\Delta I\Delta R.$$

Therefore, $V_{FS1}$=2IR+2ΔIΔR.

In a similar manner, one can find the full scale voltage across R1 and R2 when DIN is at a logic-0 level as shown below.

$$V_{FS0}=V_{N0}+V_{P0}=(I-\Delta I)(R+\Delta R)+(I+\Delta I)(R-\Delta R)$$

$$V_{FS0}=IR+I\Delta R-\Delta IR-\Delta I\Delta R+IR-I\Delta R+\Delta IR-\Delta I\Delta R$$

$$V_{FS0}=2IR-2\Delta I\Delta R$$

From the equations for $V_{FS1}$ and $V_{FS0}$ above, the gain error may be calculated as follows.

$$E_P=E_N=(IR\pm\Delta I\Delta R)/IR$$

$$E_G=\pm 2\Delta I\Delta R/2IR=\pm\Delta I\Delta R/IR$$

Figure 1:
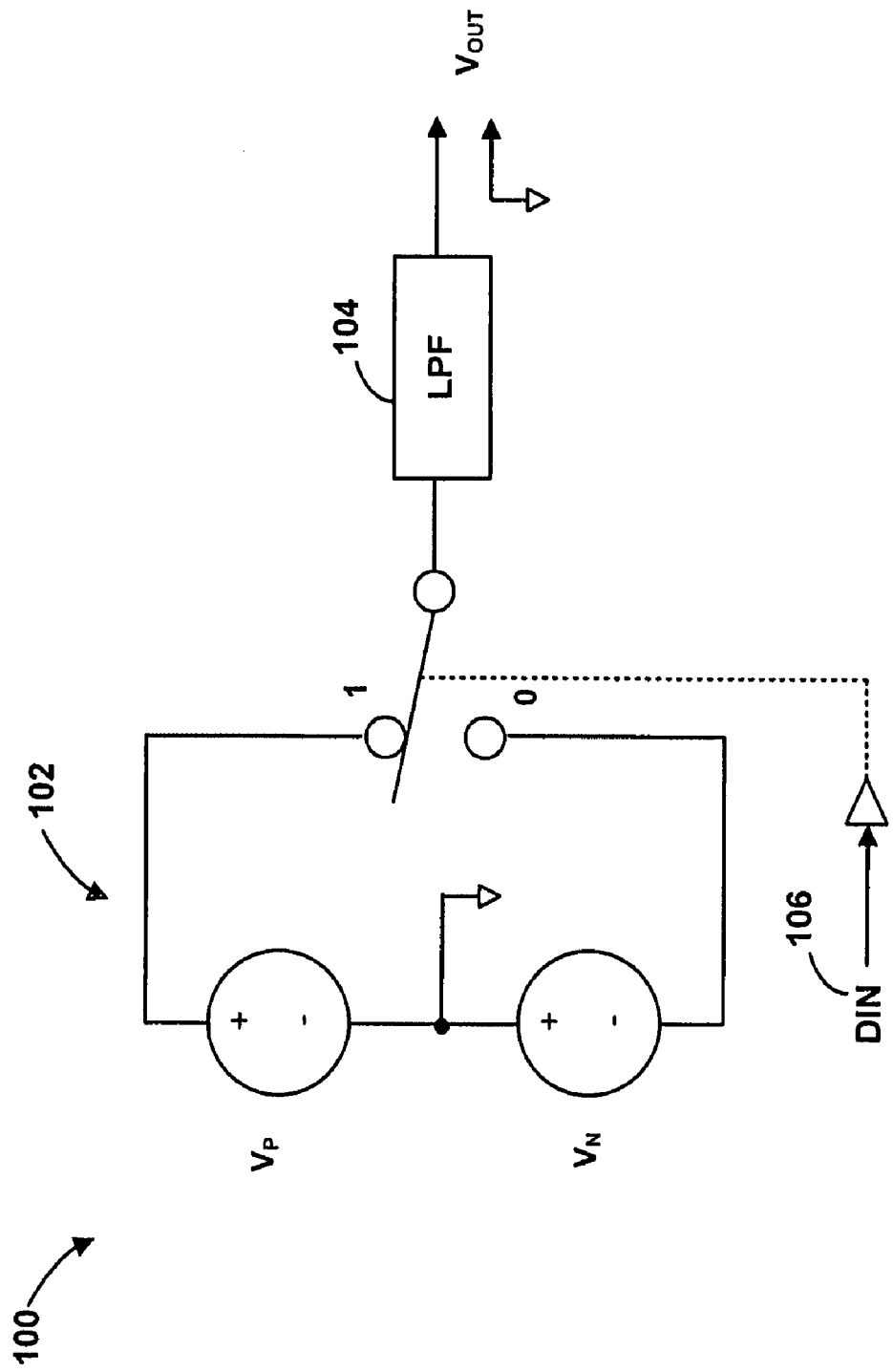
FIG. 1 is a schematic drawing of a single-ended SD DAC.

This gain error is an improvement over the gain error of typical SD DACs, such as the SD DAC described in reference to FIG. 1. Consider a numerical example where resistor matching is 0.4% (i.e., ΔR/R=0.2%). Further, the currents may be mismatched as well. A typical value to consider for the current source matching is 0.8% (i.e., ΔI/I=0.4%). Substituting these values into the equation for $E_G$ obtained above leads to a gain error of ±8 parts per million (ppm). This gain error of 8 ppm is an improvement over typical SD DACs. It should be understood that this value is based on the calculations performed above and is dependent on the assumed values mentioned above. For the sake of consistency, the same assumed values will be used throughout the detailed description in order to calculate error values and uncorrected accuracy values. It should be understood, however, that the assumed values could differ, which would lead to different values for errors and, consequently, the uncorrected accuracy.

Second, consider the effects of offset errors for the circuit of FIG. 2. An offset voltage at the V1 node, $V_{1OF}$, may be calculated as follows.

$$V_{1OF}=(V_{P1}-V_{N0})/2=(I+\Delta I)(R+\Delta R)-(I-\Delta I)(R+\Delta R)/2=\Delta I(R+\Delta R)$$

In a similar manner, an offset voltage at the $V_2$ node, $V_{2OF}$, may be calculated.

$$V_{2OF}=(V_{P0}-V_{N1})/2=(I+\Delta I)(R-\Delta R)-(I-\Delta I)(R-\Delta R)/2=\Delta I(R-\Delta R)$$

These two offset voltages are approximately equal for ΔR<<R and generate a small common mode signal (ΔIR) that will be cancelled by downstream differential receivers. However, if ΔR is not neglected, then a very small differential offset that propagates may be calculated as follows.

$$V_{OF}=V_{1OF}-V_{2OF}=\Delta I(R+\Delta R)-\Delta I(R-\Delta R)=2\Delta I\Delta R$$

The resulting offset error is $$E_{OF}=V_{OF}/V_R=2\Delta I\Delta R/IR.$$

Numerically, this results in an offset error of 16 ppm given the same assumptions about matching as in the previous example (i.e., ΔR/R=0.2% and ΔI/I=0.4%).

Given the gain errors and offset errors associated with this design of FIG. 2, this design can limit the uncorrected accuracy of the SD DAC 200 to about sixteen bits. This uncorrected accuracy of 16 bits is a significant improvement over the uncorrected accuracy of a typical SD DAC. Therefore, the SD DAC 200 has reduced offset and gain errors compared to the typical SD DACs.

In addition, the 16 bits of uncorrected accuracy result is a result of the calculations performed with the assumed matching values ΔR/R=0.2% and ΔI/I=0.4%. It should be understood that if these matching values are improved upon, the uncorrected accuracy of the SD DAC 200 may be even higher.

Figure 3:
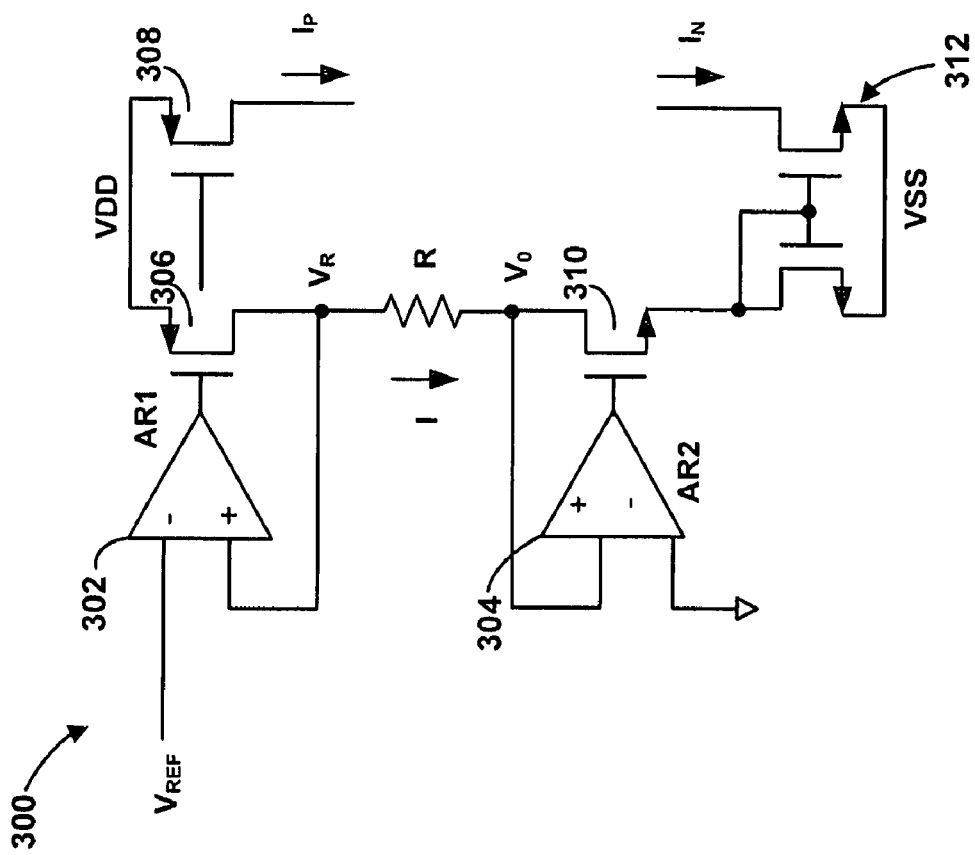
FIG. 3 is a schematic drawing of a current supply in accordance with an embodiment of the present invention.

FIG. 3 is a schematic drawing of a current supply 300 in accordance with an embodiment of the invention. The current supply 300 may be used in conjunction with the differential current-mode SD DAC of FIG. 2 in order to generate $I_P$ and $I_N$. While, the simplified schematic of FIG. 3 shows one method of generating $I_P$ and $I_N$, it should be understood that other circuits and methods for generation $I_P$ and $I_N$ are possible as well.

The current supply 300 includes an operational amplifier ("op amp") 302 and an op amp 304. Alternatively, current supply 300 may include only one op amp. The current supply 300 also includes p-type transistors 306, 308 and an n-type transistor 310. Transistors 306, 308, and 310 may preferably be CMOS transistors. For instance, transistors 306 and 308 may preferably be PMOS transistors. Further, transistor 310 may preferably be an NMOS transistor. Additionally, there is a resistor R connected between the PMOS transistor 306 and the NMOS transistor 310. The PMOS transistor 306 is coupled to the output of the op amp 302 and the NMOS transistor 310 is coupled to the output of the op amp 304. Further, a current mirror 312 is coupled to the NMOS transistor 310. Current mirror 312 may be an NMOS current mirror. Preferably, current mirror 312 is a unity gain NMOS current mirror.

In FIG. 3, three different currents are generated as a function of $V_{REF}$, the input reference voltage. Currents I and $I_P$ are generated by the PMOS transistors 306, 308. Preferably, these PMOS transistors are matched. The gates of these two PMOS transistors 306, 308 are both driven by the output of the op amp 302. The $I_N$ current is generated by the current mirror 312 driven by I at its input. Nominally, $I=I_P=I_N$ and R=R1=R2, where R1 and R2 are as shown in FIG. 2.

The op amp 304 is used to drive NMOS transistor 310 so as to regulate the voltage at the $V_O$ node to the ground potential (i.e., $V_O$=0). The op amp 302 regulates the current I through the resistor, R, so that the voltage at the $V_R$ node is maintained at the same potential as the $V_{REF}$ input (i.e., $V_R$=$V_{REF}$). Therefore, the current through each of the three resistors is nominally $$I=(V_R-V_0)/R=V_{REF}/R \text{ and}$$

$$V_P=V_N=V_{REF}.$$

With sufficient area and careful layout, it is possible to make a current mirror with 0.4% matching of the input I and output $I_N$ currents. Likewise, it is possible to keep I and $I_P$ to within 0.4% of each other so that the overall matching of $I_P$ to $I_N$ is within 0.8%. In a similar manner, it is possible to match the three resistors to within 0.4% of each other. Once again, it should be understood that these matching values are approximations. For instance, the overall matching of $I_P$ to $I_N$ may be greater than 0.8% and the matching between the resistors may be greater than 0.4%.

It is possible to consider what happens when the op amps 302, 304 have a non-zero input offset voltage. Let $V_{OFF1}$ represent the offset voltage of the op amp 302 and let $V_{OFF2}$ represent the offset voltage of the op amp 304. This causes a change in the voltage across resistor R.

$$V_R-V_0=(V_{REF}+V_{OFF1})-(0+V_{OFF2})$$

$$V_R-V_0=V_{REF}+V_{OFF1}-V_{OFF2}$$

If the op amp 302 and the op amp 304 are perfectly matched, then the two offset voltages cancel leaving $V_R-V_0=V_{REF}$.

However, if the op amps 302, 304 are not perfectly matched, there will be a gain error that is proportional to the difference in offset voltages.

$$E_G=(V_{OFF1}-V_{OFF2})/V_{REF}$$

For two matched op amps on the same IC die, it is reasonable to expect matching of offset voltages to within 10%; i.e, $$E_G=V_{OFF}/10V_{REF}$$

Following the same numerical example as before (i.e., $V_{REF}$=2 V and $V_{OFF}$=4 mV), these equations lead to an SD DAC gain error of about 200 ppm when the circuits of FIGS. 2 and 3 are combined. This SD DAC gain error is better than the gain error of a typical SD DAC. Specifically, the combination of FIGS. 2-3 would create an SD DAC with about twelve bits of uncorrected accuracy rather than eight bits. Additional uncorrected accuracy for the SD DAC may be obtained with improved op amp matching.

As previously mentioned, these values are dependent upon the assumed values for resistor matching, current matching, and voltages mentioned above. These assumed values are approximations. However, it should be understood that these values could be greater or less. Therefore, in certain situations having different values, the uncorrected accuracy may be greater or less.

An SD DAC in accordance with an embodiment of the present invention may be implemented on CMOS (Complementary Metal Oxide Semiconductor) ICs for superior voltage accuracy. An SD DAC with such accuracy may be useful in many different types of systems. In one example, this SD DAC may be particularly suited to Micro Electromechanical System (MEMS) based accelerometers. The SD DAC in accordance with an embodiment of the invention may preferably be used in a variety of additional signal processing applications. For instance, the SD DAC may be used in audio applications, video applications, machine control, and automatic control systems. Other applications are possible as well.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

I claim:

1. A sigma-delta digital-to-analog converter (SD DAC) comprising:

a low pass filter comprising first and second inputs;

first and second resistances each having first and second terminals, wherein the first terminals of the first and second resistances are respectively coupled to the first and second inputs of the low pass filter, and wherein the second terminals of the first and second resistances are respectively coupled together at a common node;

a current supply; and a switching network for supplying current from the current supply to the first and second resistances, wherein the current supply and the first and second resistances operate to generate a first voltage and a second voltage at the first and second inputs of the low pass filter, wherein the current supply comprises:
a first operational amplifier and a second operational amplifier;
a first and second p-type transistor, wherein the first and second p-type transistors are coupled, and wherein the first p-type transistor is coupled to an output of the first operational amplifier;
an n-type transistor, wherein the n-type transistor is coupled to an output of the second operational amplifier; and
a current mirror, wherein the current mirror is coupled to the n-type transistor, wherein the first and second p-type transistors generate a first and second current, and wherein the current mirror generates a third current based on the first current.

2. The SD DAC of claim 1, wherein the common node between the first and second resistances is coupled to a ground.

3. The SD DAC of claim 1, wherein the current supply comprises a first current source and a second current source.

4. The SD DAC of claim 3, wherein the first current source and second current source are matched to within at least 0.8%.

5. The SD DAC of claim 1, wherein the first and second resistances are matched to within at least 0.4%

6. The SD DAC of claim 1, wherein the switching network is coupled to receive a control signal.

7. The SD DAC of claim 6, wherein the control signal is a digital input signal.

8. The SD DAC of claim 7, wherein the current supply comprises a first current source and a second current source, and wherein, when the digital input signal is at a logic-1 level, the switching network operates to (i) supply current from the first current source to the first resistance, forming a first voltage at the first input of the low pass filter, and (ii) supply current from the second current source to the second resistance, forming a second voltage at the second input of the low pass filter.

9. The SD DAC of claim 7, wherein the current supply comprises a first current source and a second current source, and wherein, when the digital input signal is at a logic-0 level, the switching network operates to (i) supply current from the first current source to the second resistance, forming a first voltage at the second input of the low pass filter, and (ii) supply current from the second current source to the first resistance, forming a second voltage at the first input of the low pass filter.

10. The SD DAC of claim 1, wherein the switching network comprises a plurality of transistors.

11. The SD DAC of claim 1, wherein the second current and third current are matched to within at least 0.8%.

12. The SD DAC of claim 1, wherein the SD DAC has an accuracy of at least 12 bits.

13. An SD DAC comprising:
a low pass filter comprising first and second inputs;
first and second resistances each having first and second terminals, wherein the first terminals of the first and second resistances are respectively coupled to the first and second inputs of the low pass filter, and wherein the second terminals of the first and second resistances are respectively coupled together at a common node;
a current supply, wherein the current supply comprises a first current source and second current source; and
a switching network comprising a plurality of transistors for supplying current from the first current source and the second current source to the first and second resistances, wherein the switching network is coupled to receive a digital input signal, and wherein the current supply and the first and second resistances generate a first voltage and a second voltage at the first and second inputs of the low pass filter based on the digital input signal,
wherein the current supply comprises:
a first operational amplifier and a second operational amplifier;
a first and second p-type transistor, wherein the first and second p-type transistors are coupled, and wherein the first p-type transistor is coupled to an output of the first operational amplifier;
an n-type transistor, wherein the n-type transistor is coupled to an output of the second operational amplifier; and
a current mirror, wherein the current mirror is coupled to the n-type transistor, wherein the first and second p-type transistors generate a first and second current, and
wherein the current mirror generates a third current based on the first current.

14. The SD DAC of claim 13, wherein the SD DAC has an accuracy of at least 12 bits.

15. A method for generating positive and negative reference voltages in an SD DAC, the method comprising:
receiving a first and second current from a current supply;
switching the first and second current between a first resistance and second resistance, wherein the first resistance is coupled to a first input of a low pass filter and the second resistance is coupled to a second input of the low pass filter; and
generating a first voltage at the first input of the low pass filter and a second voltage at the second input of the low pass filter,
wherein the current supply comprises:
a first operational amplifier and a second operational amplifier;
a first and second p-type transistor, wherein the first and second p-type transistors are coupled, and wherein the first p-type transistor is coupled to an output of the first operational amplifier;
an n-type transistor, wherein the n-type transistor is coupled to an output of the second operational amplifier; and
a current mirror, wherein the current mirror is coupled to the n-type transistor, wherein the first and second p-type transistors generate the first current and a third current, and wherein the current mirror generates the second current based on the third current.

16. The method of claim 15, wherein the first and second resistances are respectively coupled together at a common node.

17. The method of claim 15, further comprising:
receiving a digital input signal, and wherein switching the first and second current between a first and second resistance comprises providing the first current to the first resistance and the second current to the second resistance when the digital input signal is at a logic-1 level and providing the first current to the second resistance and the second current to the first resistance when the digital input signal is at a logic-0 level.

18. The method of claim 15, wherein the first and second resistances are matched to within at least 0.4%.

19. The method of claim 15, wherein the first current and the second current are matched to within at least 0.8%.

* * * * *